United States Patent [19]
McCarthy

[11] Patent Number: 4,964,198
[45] Date of Patent: Oct. 23, 1990

[54] V-SHAPED CLIP FOR ATTACHING A SEMICONDUCTOR DEVICE TO A HEAT SINK

[75] Inventor: Alfred F. McCarthy, Belmont, N.H.

[73] Assignee: Avvid Engineering, Inc., Laconia, N.H.

[21] Appl. No.: 247,367

[22] Filed: Sep. 21, 1988

[51] Int. Cl.⁵ .............................................. H05K 7/20
[52] U.S. Cl. .................................... 24/458; 165/185; 174/16.3; 361/386
[58] Field of Search ......................... 357/81; 174/16.3; 361/386, 388, 417, 419, 420, 427; 165/185, 80.2, 80.3; 24/295, 458, 573, 625

[56] References Cited
U.S. PATENT DOCUMENTS

| | | | |
|---|---|---|---|
| 3,066,367 | 12/1962 | Garman | 24/458 |
| 3,673,643 | 7/1972 | Kindell | 24/458 |
| 3,917,370 | 11/1925 | Thornton | 361/415 |
| 4,710,852 | 12/1987 | Keen | 361/386 |

Primary Examiner—Gerald P. Tolin
Attorney, Agent, or Firm—Fish & Richardson

[57] ABSTRACT

A resilient spring clip for attaching a semiconductor to a heat sink comprising a first surface and an attachment means, the attachment means comprising a pair of V-shaped legs adapted to fit into and be secured to a slot in a heat sink so that the first surface spring-engages the semiconductor and holds it to the heat sink, the clip taking up little extra space.

5 Claims, 1 Drawing Sheet

V-SHAPED CLIP FOR ATTACHING A SEMICONDUCTOR DEVICE TO A HEAT SINK

FIELD OF THE INVENTION

This invention relates to dissipation of heat from electronic semiconductor devices, and in particular, the attachment of such semiconductors to heat sinks for that purpose.

BACKGROUND OF THE INVENTION

The use of semiconductors is limited not only by their size but in particular by the size of the heat sinks that must be used with them. Indeed, heat sinks, which successfully expel and prevent heat build-up as the semiconductors operate, are often far larger and more bulky than the semiconductors themselves. In addition, the means for attaching the semiconductor to the heat sink may also be bukly, and the attaching mechanism may extend well beyond the semiconductor thereby wasting additional space. This is of primary importance in those applications where the heat sink is a flat plate and where a number of such plates with their semiconductors must be mounted together in parallel in as small a space as possible. Hence, there is a need for a compact means of attaching a semiconductor device to a heat sink.

One way of attaching a semiconductor to a heat sink is by use of a resilient spring clip. However, spring clips can be large and difficult to use. As a result, there is a need for a clip attachment which is small and compact, easy to attach, and which will permit heat sink plates to be placed very close to each other.

SUMMARY OF THE INVENTION

The present invention comprises a resilient spring clip for use in attaching a semiconductor to a heat sink so that the resulting semiconductor-heat sink combination is as compact as possible. The clip of this invention also permits easy assembly of the semiconductor to the heat sink.

In the preferred embodiment, the resilient clip of this invention is metal and unitary. It has two principal portions. First, there is an indented top with two edges opposite each other. When in use, a semiconductor fits underneath the top and between the edges. A connecting plate extends from the end of the top opposite the edges and connects to an attachment means. The attachment means generally comprises a V-shaped portion having an outer lip and an inner lip at opposite edges of its opening. The lips are generally parallel to the indented top and perpendicular to the connecting plate. A shelf is disposed under, but spaced apart from, the inner lip.

In operation, the clip is installed on a heat sink so that the indented top contacts the semiconductor to be attached The edges extend downwardly from the top and partially surround the semiconductor. The clip is secured to a heat sink by the attachment means, with the V-shaped portion fitting into a slot through the heat sink. The V-shaped portion, which is resilient, is flexed inwardly to allow the shelf to fit through the slot on the heat sink. Once the shelf is through the slot, the V-shaped portion flexes back to its original position. The clip is thus secured to the heat sinks as the shelf fits below and extends over a part of the heat sink below the slot while the lips extend over part of the heat sink on the other side of the slot. Thus, the lips and the shelf prevent the clip from coming off. The clip can be removed to replace the semiconductor by reflexing its V-shaped portion again. The semiconductor itself fits between the indented top and the heat sink, and it is held in place by the spring like, downward tension on it created by the top when the clip is disposed in the slot.

The clip of the invention is simple and inexpensive to manufacture, and assembly onto the heat sink is rapid and straightforward. Removal is equally simple, requiring only a flexing of the V-shaped portion to force the shelf inwardly to allow to to again pass through the slot. The clip itself is compact, so that when assembly is complete, the clip projects only minimal a distance, beyond the semiconductor thereby allowing the heat sink with the semiconductors mounted on them to be packed closely together.

DESCRIPTION OF THE PREFERRED EMBODIMENTS

I now turn to the description of the preferred embodiment, after first briefly describing the drawings.

Drawings

STRUCTURE

Figure 1:
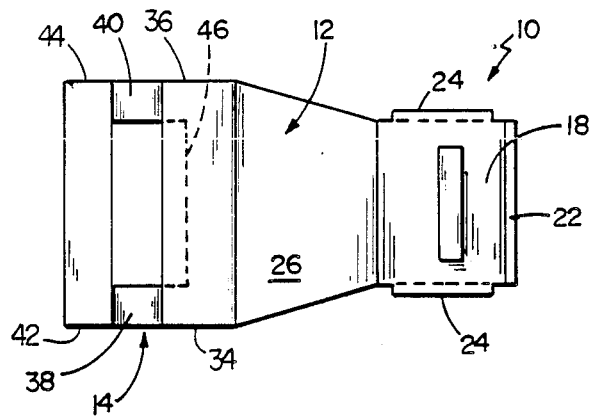
FIG. 1 is a top view of a retaining clip of the invention.
Figure 2:
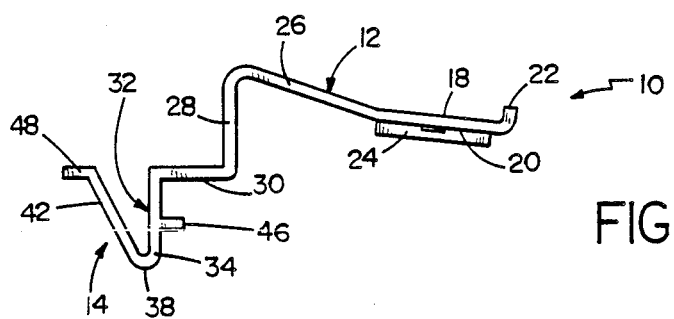
FIG. 2 is a side view of the clip of the invention.

With reference to FIGS. 1 and 2, a retaining clip according to the invention is shown at 10. Retaining clip 10 generally includes a top portion 12 and an attachment means 14.

The top portion 12 of the retaining clip 10 has two sections. The first is a flat section 18, having a semiconductor contact surface 20 on its underside. It is bounded on one end by an upwardly angled wall 22 on its front edge opposite the attachment means 14. As best shown in FIG. 2, the flat section is also bounded by a pair of downwardly extending walls 24 on its side edges. The second part of the top portion 12, is a spring section 26 which extends upwardly at an angle from the edge of the flat section 18 opposite its wall 22. The spring section 26 is generally trapezoidal with its longest side away from the flat section 18.

A leg 28 extends downwardly from the longest side of the spring section 26, and the leg 28 attaches to the attachment means 14 The attachment means 14 comprises a first lip 30 which extends generally parallel to the top portion 12 from the leg 28 to a V-shaped section 32. The V shaped section 32 comprises a pair of downwardly extending legs 34, 36 disposed at and extending from opposite ends of the first lip 30. Each by 34, 36 forms an apex 38, 40 away from first lip 30 with angled legs 42, 44. A shelf 46 extends between legs 34, 36 below the first lip 30. A second lip 48 extends from the legs 42, 44 parallel to the first lip 30. The V-shaped section 32 is generally resilient and flexes inwardly when pressure is applied to the legs 42, 44 at the end near the second lip 48.

Figure 3:
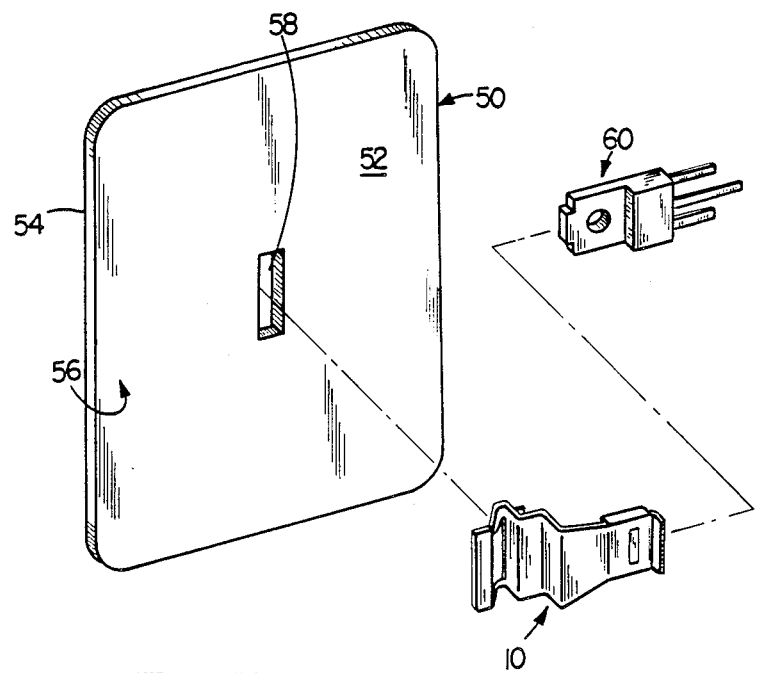
FIG. 3 is an exploded view of a heat sink, clip and semiconductor assembly.

With reference to FIG. 3, a heat sink 50 suitable for use in conjunction with clip 10 is shown. Heat sink 50 is generally a flat plate 52 having a first surface 54 and a second surface 56. The plate 52 is adopted for mounting on a printed circuit board in an upright position. The attachment means are not shown. A slot 58 extends through the plate 52.

Referring to FIG. 3, the assembly of a clip 10 to a semiconductor 60 and the heat sink 50 is shown. Clip 10 is first fit into the slot 58. A slight manual pressure is applied to the legs 34, 36 and 42, 44 of the V-shaped section 32 so that the legs flex inwardly toward each other. The clip 10 is then pressed downwardly into the slot 58. The shelf 46 passes through the slot 58 along with the apexes 38, 40 of the legs, and the heat sink plate 52 fits between the first lip 30 and the shelf 46. At the same time, the second lip 48 is disposed above the plate 52. This locks the clip 10 in place. The semiconductor 60 can be installed by slipping it beneath the flat surface 18 of the top section 12. The spring-like action of the spring section 28 forces the surface 18 against the semiconductor 60 and the heat sink 60, holding the semiconductor in place. The semiconductor can be easily removed by pulling it out from under the top portion 12.

It should be appreciated that when assembled, the clip 10 does not project much beyond the semiconductor 60 so that the heat sink with the clip and semiconductor does not take up much more space than the heat sink and semiconductor itself. Further, it should also be appreciated that the assembly of the clip and the heat sink does not require any special tools, and disassembly (to replace a defective semiconductor, for example) is simple.

Other embodiments will occur to those skilled in the art.

What I claim is:

1. A clip for attaching a semiconductor to a heat sink comprising:
   a first surface,
       said first surface having a flat section with a pair of sidewalls extending downwardly therefrom so as to define an opening adapted to receive a semiconductor when said clip is in use wherein said flat section contacts the semiconductor which is held in place by said sidewalls,
   said flat section being connected to an upwardly angled spring section,
   an attachment means,
       said attachment means connected to said spring section of said first surface, said attachment means comprising a V-shaped portion having at least a first and a second leg, said legs being joined at one end to form an apex and being spaced apart at their opposite ends,
       said V-shaped portion having a connecting leg, said connecting leg being attached to said spring section,
       said V-shaped portion having lip means and shelf means which are spaced apart,
       whereby when said clip is in use said V-shaped portion, which si resilient, is compressed so as to insert it into a slot in the heat sink, so that when said V-shaped portion is allowed to flex back to is normal position, the portion of the heat sink adjacent to the slot is secured between said lip means and said shelf means and as a result when a semiconductor is placed in said opening, said spring section forces said flat section in a direction parallel to said V-shaped portion against said semiconductor to hold it in place on the heat sink.

2. The clip of claim 1 wherein said lip means comprises a first lip, said first lip extending from one end of said first leg opposite said apex.

3. The clip of claim 2 wherein said lips means comprises a second lip, said second lip extending from one end of said second leg opposite said apex, said second lip being parallel to said first lip.

4. The clip of claim 3 wherein said shelf means comprises a shelf disposed on said first leg parallel to but spaced apart from said first lip means thereby forming a space for holding a portion of the heat sink.

5. The clip of claim 4 wherein said first lip is connected to said connecting leg which is perpendicular to it, said connecting leg being attached to said spring portion at the end opposite said first lip.

* * * * *